US009805704B1

(12) United States Patent
Abel

(10) Patent No.: US 9,805,704 B1
(45) Date of Patent: Oct. 31, 2017

(54) METHOD AND SYSTEM FOR ARTIFICIAL REVERBERATION USING MODAL DECOMPOSITION

(71) Applicant: Jonathan S. Abel, Menlo Park, CA (US)

(72) Inventor: Jonathan S. Abel, Menlo Park, CA (US)

( * ) Notice: Subject to any disclaimer, the term of this patent is extended or adjusted under 35 U.S.C. 154(b) by 0 days.

(21) Appl. No.: 14/558,531

(22) Filed: Dec. 2, 2014

Related U.S. Application Data

(60) Provisional application No. 61/910,548, filed on Dec. 2, 2013, provisional application No. 61/913,093, filed on Dec. 6, 2013, provisional application No. 62/061,219, filed on Oct. 8, 2014.

(51) Int. Cl.
*H03G 3/00* (2006.01)
*G10H 5/02* (2006.01)

(52) U.S. Cl.
CPC .................................... *G10H 5/02* (2013.01)

(58) Field of Classification Search
None
See application file for complete search history.

(56) References Cited

U.S. PATENT DOCUMENTS 2,230,836 A 2/1941 Hammond
5,502,747 A 3/1996 McGrath
5,748,513 A * 5/1998 Van Duyne ......... B29C 65/7873 708/320
2013/0202125 A1* 8/2013 De Sena ................ G10K 15/12 381/63

OTHER PUBLICATIONS

Karjalainen, Matti, and Hanna Jarvelainen. "More about this reverberation science: Perceptually good late reverberation." Audio Engineering Society (2001).*
Makivirta, Aki, Poju Antsalo, Matti Karjalainen, and Vesa Valimaki. "Low-Frequency Modal Equalization of Loudspeaker-Room Responses." AES 111, Sep. 2001.*
Morse et al., "Theoretical Acoustics", Princeton University Press, 1987, pp. 467-607.
Abel et al., "Luciverb: Iterated Convolution for the Impatient," Audio Engineering Society Convention 133, Oct. 2012, pp. 1-10.
Della Pietra et al., "On the Dynamic Behavior of Axially Excited Helical Springs," Meccanica, vol. 17, pp. 31-43, 1982.

(Continued)

*Primary Examiner* — Joseph Saunders, Jr.
*Assistant Examiner* — James Mooney
(74) *Attorney, Agent, or Firm* — Foley & Lardner LLP; Mark J. Danielson

(57) ABSTRACT

In general, the present invention relates to a method and system for synthesizing artificial reverberation using modal analysis of a room or resonating object. In one embodiment of the inventive system, a collection of resonant filters is employed, each driven by the source signal, and their outputs summed. With filter resonance frequencies and dampings tuned to the modal frequencies and decay times of the acoustic space or resonating object being simulated, and filter gains set according to the source and listener positions within the space or object, any number of acoustic spaces and resonant objects may be simulated.

11 Claims, 14 Drawing Sheets

(56) References Cited

OTHER PUBLICATIONS

Fletcher et al., "The Physics of Musical Instruments," 2nd ed., Springer, 2010, pp. 128-130.
Garcia, "Optimal Filter Partition for Efficient Convolution with Short Input/Output Delay," Audio Engineering Society Convention 113, Oct. 2002, pp. 1-9.
Gardner, "Efficient Convolution without Input-Output Delay," J. Audio Eng. Soc., vol. 43, No. 3, pp. 127-136, 1995.
Jot, "Digital Delay Networks for Designing Artificial Reverberators," in Audio Engineering Society Convention 90, Feb. 1991, pp. 1-17.
Lee et al., "A Reverberator with Two-Stage Decay and Onset Time Controls," Audio Engineering Society Convention 129, preprint No. 8208, Nov. 2010, pp. 1-6.
Meinema et al., "A New Reverberation Device for High Fidelity Systems," J. Audio Eng. Soc., vol. 9, No. 4, pp. 284-289, 324-326, 1961.
Mathews et al., "Methods for Synthesizing Very High {Q} Parametrically Well Behaved Two Pole Filters," Proc. Swedish Musical Acoustics Conference, Aug. 2003, pp. 1-4.
Schroeder, "Natural Sounding Artificial Reverberation," Audio Engineering Society Convention 13, Oct. 1961, pp. 1-18.
Valimaki et al., "Fifty Years of Artificial Reverberation," IEEE Transactions on Audio, Speech, and Language Processing, vol. 20, No. 5, pp. 1421-1448, Jul. 2012.

* cited by examiner

METHOD AND SYSTEM FOR ARTIFICIAL REVERBERATION USING MODAL DECOMPOSITION

CROSS-REFERENCE TO RELATED APPLICATIONS

The present application claims priority to U.S. Prov. Appln. No. 61/910,548, filed Dec. 2, 2013, U.S. Prov. Appln. No. 61/913,093, filed Dec. 6, 2013 and U.S. Prov. Appln. No. 62/061,219, filed Oct. 8, 2014, the contents of all such applications being hereby incorporated by reference herein in their entireties.

FIELD OF THE INVENTION

The present invention relates generally to audio signal processing, and more particularly to systems and methods for artificial reverberation, including computational structures for simulating room acoustics.

BACKGROUND OF THE INVENTION

Sound created in an enclosed space will interact with the surfaces and objects of the space, and will convey to the listener not only particulars of the sound source, but also a sense of the architecture and materials present in the space—for instance, consider the sounds in a small wood-frame church compared to those in a racquetball court. As a result, artificial reverberation is widely used in music and film production to place sounds in an architectural context or produce a desired "feel." Furthermore, the acoustics of the space help convey the positions of the source and listener within the space. Recording engineers will carefully place microphones in a room to adjust the timbre and spatial balance of the recording, and film audio engineers will separately manipulate wet and dry versions of a sound source according to its position in an attempt to simulate motion of the source or listener within a space.

Commercially available digital reverberators are typically implemented using either delay line networks or convolution (see, e.g. V. Valimaki et al., "Fifty Years of Artificial Reverberation," IEEE Transactions on Audio, Speech, and Language Processing, vol. 20, no. 5, pp. 1421-1448, July, 2012 ("Valimaki")). Convolutional reverberators imprint audio with a desired room impulse response, using frequency domain methods for computational efficiency, while dividing the impulse response into segments to minimize computational latency (see, e.g., W. G. Gardner, "Efficient Convolution without Input-Output Delay," J. Audio Eng. Soc., vol. 43, no. 3, pp. 127-136, 1995; D. S. McGrath, "Method and apparatus for filtering an electronic environment with improved accuracy and efficiency and short flow-through delay," U.S. Pat. No. 5,502,747, Mar. 26, 1996; and G. Garcia, "Optimal Filter Partition for Efficient Convolution with Short Input/Output Delay," Audio Engineering Society Convention 113, October, 2002). These methods may be able to faithfully reproduce the desired room impulse response, but are difficult to interactively control, and can be computationally expensive, requiring memory and computation roughly in proportion to the room impulse response length. The indexing required by the FFT and sample memory needed make on-chip implementation difficult.

Networks of delay lines and filters can be configured to produce responses that are perceptually similar to those of room reverberation, with a set of early reflections giving way to a dense late field reverberation (see, e.g. Valimaki). Using such structures, gross reverberation features, e.g., the late field reverberation equalization and decay times, may be interactively adjusted, but details of the timbre are difficult to control. Schroeder-type (e.g. M. R. Schroeder, "Natural Sounding Artificial Reverberation," Audio Engineering Society Convention 13, October, 1961) and feedback delay network (e.g. J. M. Jot, "Digital Delay Networks for Designing Artificial Reverberators," in Audio Engineering Society Convention 90, February, 1991) structures are widely used and efficient computationally, though they require on the order of one or two seconds of memory to produce high-quality reverberation.

Thus there is a need for an artificial reverberator that both can faithfully reproduce a given acoustic space and can be interactively controlled. There is also a need for artificial reverberation methods which require little memory. Additionally, there is a need for an artificial reverberator which allows movement of a source and/or listener within an acoustic space. Similarly, there is a need for an artificial reverberation method which efficiently processes multiple sources or listeners.

SUMMARY OF THE INVENTION

In general, the present invention relates to a method and system for synthesizing artificial reverberation using modal analysis of a room or resonating object. In one embodiment of the inventive system, a collection of resonant filters is employed, each driven by the source signal, and their outputs summed. With filter resonance frequencies and dampings tuned to the modal frequencies and decay times of the acoustic space or resonating object being simulated, and filter gains set according to the source and listener positions within the space or object, any number of acoustic spaces and resonant objects may be simulated.

In accordance with these and other aspects, a method according to embodiments of the invention includes receiving a source signal, applying, by the computer, artificial reverberation to the source signal by processing the source signal in parallel using a plurality of mode filters, wherein the plurality of mode filters have been designed in accordance with desired properties of one of a room and a resonating object, and summing outputs of the plurality of mode filters to produce an artificially reverberated version of the source signal.

BRIEF DESCRIPTION OF THE DRAWINGS

These and other aspects and features of the present invention will become apparent to those ordinarily skilled in the art upon review of the following description of specific embodiments of the invention in conjunction with the accompanying figures, wherein.

DETAILED DESCRIPTION OF THE PREFERRED EMBODIMENTS

Figure 1:
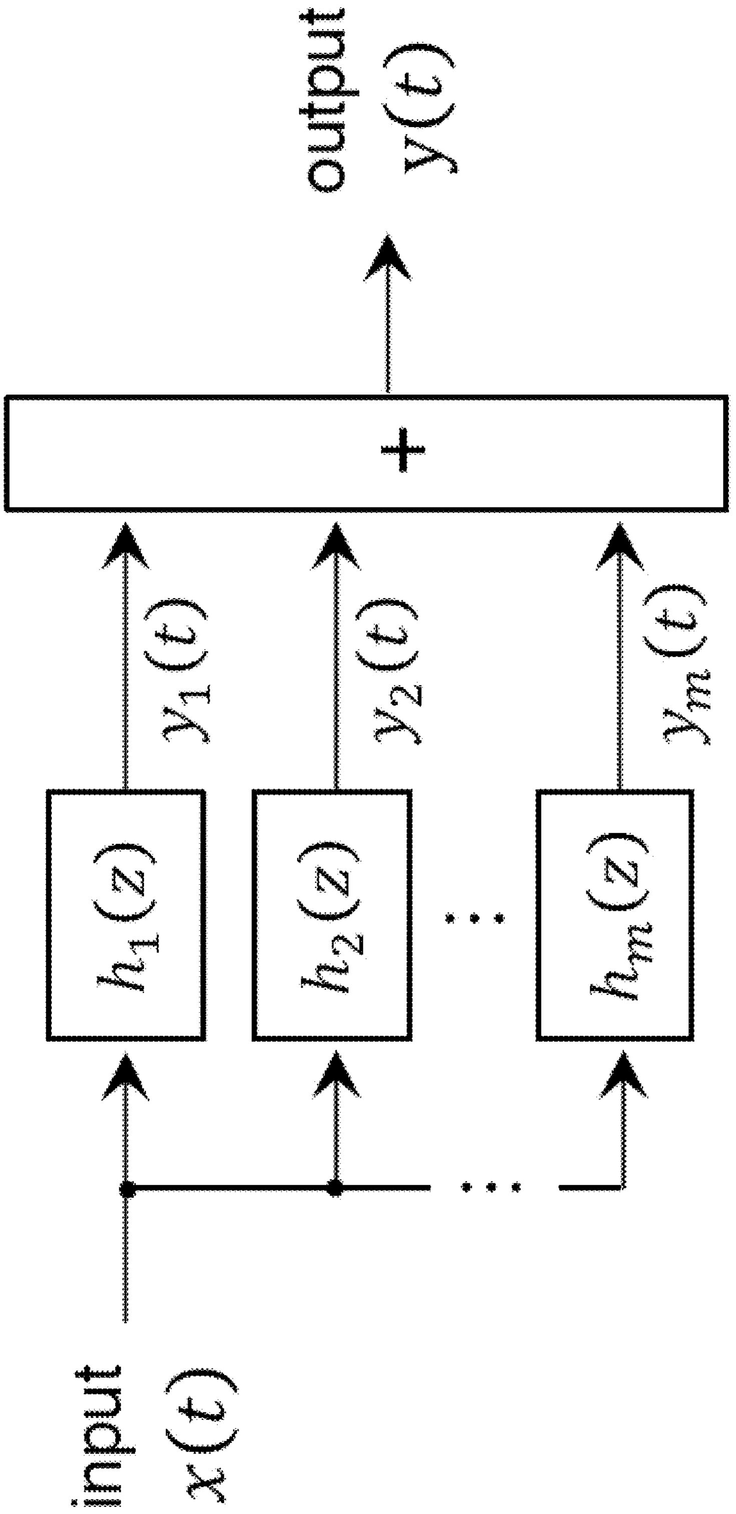
FIG. 1 is a block diagram illustrating an example Modal Reverberator Architecture according to embodiments of the invention. The modal reverberator is the parallel combination of resonant filters matched to the modes of the system.

The present invention will now be described in detail with reference to the drawings, which are provided as illustrative examples of the invention so as to enable those skilled in the art to practice the invention. Notably, the figures and examples below are not meant to limit the scope of the present invention to a single embodiment, but other embodiments are possible by way of interchange of some or all of the described or illustrated elements. Moreover, where certain elements of the present invention can be partially or fully implemented using known components, only those portions of such known components that are necessary for an understanding of the present invention will be described, and detailed descriptions of other portions of such known components will be omitted so as not to obscure the invention. Embodiments described as being implemented in software should not be limited thereto, but can include embodiments implemented in hardware, or combinations of software and hardware, and vice-versa, as will be apparent to those skilled in the art, unless otherwise specified herein. In the present specification, an embodiment showing a singular component should not be considered limiting; rather, the invention is intended to encompass other embodiments including a plurality of the same component, and vice-versa, unless explicitly stated otherwise herein. Moreover, applicants do not intend for any term in the specification or claims to be ascribed an uncommon or special meaning unless explicitly set forth as such. Further, the present invention encompasses present and future known equivalents to the known components referred to herein by way of illustration.

According to certain aspects, embodiments of the invention consider room reverberation from the point of view of modal analysis, and describes an artificial reverberation method based on a modal decomposition of a desired reverberation impulse response. According to certain other aspects, the present inventors have analyzed conventional approaches such as Alvin Lucier's iterated convolution (see, e.g. J. S. Abel et al., "Luciverb: Iterated Convolution for the Impatient," Audio Engineering Society Convention 133, October, 2012), wherein a room impulse response is repeatedly convolved with itself. The process has the effect of making audible a number of room modes, as quiet modes are progressively eliminated and energetic modes become separated in time. The present inventors have discovered that the iterated convolution process was very costly to implement in terms of memory and computation using standard means, and an inventive step was to implement the mode responses directly.

According to certain further aspects, the present inventors recognize that modal analysis of acoustic spaces is well established, describing room reverberation as the linear combination of characteristic resonances (see, e.g., P. M. Morse et al., "Theoretical Acoustics", Princeton University Press, 1987; and N. Fletcher et al., "The Physics of Musical Instruments," 2nd ed., Springer, 2010).

Embodiments of the invention, therefore, introduce a computational structure employing a modal decomposition for synthesizing room reverberation and the reverberant responses of resonant objects and systems. Termed the "modal reverberator," an aspect of the invention is to implement the room modes using separate resonant filters, each driven by the source signal and summed in a parallel structure to form the output, as seen in FIG. 1. The parallel architecture provides explicit, interactive control over the parameters of each mode, allowing accurate modeling of acoustic spaces, as well as movement within them and morphing among them. It also provides an efficient architecture in which to implement iterated convolution.

According to certain aspects, embodiments of the invention therefore provide an artificial reverberator system and method which has a small memory footprint, and is simultaneously interactively controllable and faithful to a desired space or resonant object. In these and other embodiments, the invention provides accurate rendering of movement within a given space or resonant object, and provides efficient simulation of multiple sources and listeners.

According certain other aspects, the inventions provide precise control over the envelope of frequency bands of the reverberation impulse response. This envelope control can be in the form of a two-stage decay or delayed onset (e.g. K.

Lee et al., "A Reverberator with Two-Stage Decay and Onset Time Controls," Audio Engineering Society Convention 129, preprint no. 8208, November, 2010), as well as a "Luciverb"-style envelope (see, e.g. J. S. Abel et al. "Luciverb: Iterated Convolution for the Impatient," Audio Engineering Society Convention 133, October, 2012), or an arbitrary, user-defined function.

According to certain additional aspects, the invention provides morphing among two or more acoustic spaces or resonate objects.

In accordance with the above and other aspects, in some embodiments of the invention, an artificial reverberator is implemented using a parallel set of resonant "mode" filters, each identified with a resonant mode. In related embodiments, the mode filters are implemented using a first-order filter with a complex pole and/or a heterodyne-modulation scheme.

In another embodiment of the invention, complex input and/or output gains are identified with source and/or listener positions within an acoustic space or resonant object. In an additional embodiment, multiple source signals are scaled and summed to form mode filter inputs, and multiple listener signals are formed by summing scaled mode filter outputs using mode scaling factors specific to each listener and mode. In a related embodiment, source and listener movement is interactively simulated by adjusting possibly complex scale factors at the inputs and outputs of the mode filters.

In yet another embodiment, a method for designing a modal reverberator fits mode parameters such as mode frequency, mode damping, and mode gain to measurements of a desired response, for example that of an acoustic space, plate reverberator or spring reverberator. A related embodiment is a method for designing a modal reverberator wherein the mode parameters are derived analytically, such as might be available for a spring reverberator, with or without a "wash" resulting from randomly perturbed masses and/or stiffnesses in a spring-mass model of the helical coil. Another related embodiment is a method to design the mode parameters according to decay times and equalizations specified by the user.

In a set of embodiments, the envelope of any given mode is controlled, for example producing two-stage decay or delayed-onset envelopes, using multiple first-order filters as part of the mode filter. Another embodiment is a method for producing a "Luciverb"-type reverberator involving the cascade of multiple identical first-order filters as part of each mode filter. A related embodiment uses an FIR filter to implement an arbitrary, user-defined mode envelope.

In the following, the inventive modal reverberator signal flow architecture is described, as is the implementation and design of the mode filters. Design examples are presented next to illustrate aspects of the invention, including methods for deriving the needed modal parameters from a measured impulse response of a medium-sized room, an analytical model of an electro-mechanical spring reverberator, and psychoacoustic parameters describing late-field reverberation. Additional aspects of the invention, such as techniques for interactive control of modal parameters, efficient implementation of multiple sources and/or multiple listeners, and efficient implementation of iterated convolution are described.

Modal Reverberator Design Approach

Denoting by h(t) the impulse response of a linear system, where t is the discrete time sample index, the system output y(t) can be written as a convolution of the impulse response with the input x(t), $$y(t)=h(t)*x(t). \tag{1}$$

Acoustic spaces and vibrating objects have long been analyzed in terms of their normal modes (see, e.g., P. M. Morse et al., "Theoretical Acoustics," Princeton University Press, 1987 and N. Fletcher et al., "The Physics of Musical Instruments," 2nd ed., Springer, 2010), and the system impulse response h(t) may be expressed as the linear combination of modal responses, $$h(t)=\sum_{m=1}^{M} h_m(t), \tag{2}$$

where the system has M modes, with the mth mode response denoted by $h_m(t)$. In this way, the system output is seen to be the sum of the mode outputs, $$y(t)=\sum_{m=1}^{M} y_m(t),\ y_m(t)=h_m(t)*x(t), \tag{3}$$

where the mth mode output $y_m(t)$ is the mth mode response convolved with the input.

The mode responses $h_m(t)$ are complex exponentials each characterized by a mode frequency $\omega_m$, mode damping $\alpha_m$ and complex mode amplitude $\gamma_m$, $$h_m(t)=\gamma_m\exp\{(j\omega_m-\alpha_m)t\}. \tag{4}$$

The mode frequencies and dampings are properties of the room or object, and describe the mode oscillation frequencies and decay times. The mode amplitudes are determined by the sound source and listener positions (i.e. driver and pick-up positions for an electro-mechanical device), according to the spatial patterns of the modes.

The modal reverberator architecture is simply the parallel combination of mode filters, each computing the response to a particular mode m, as expressed by Eq. 3 and shown in FIG. 1. Any number of numerically stable methods may be used to implement the resonant mode filters, including phasor filters (e.g. M. Mathews et al., "Methods for Synthesizing Very High {Q} Parametrically Well Behaved Two Pole Filters," Proc. Swedish Musical Acoustics Conference, August, 2003) in which each mode filter is implemented as a complex first-order update, $$y_m(t)=\gamma_m x(t)+e^{(j\omega_m-\alpha_m)}y_m(t-1). \tag{5}$$

Another numerically stable computational structure for implementing the mode filters involves heterodyning the input signal to dc, applying the mode envelope filter, and modulating the filtered amplitude to the audio band. Stated mathematically, the heterodyned signal d(t) is formed by multiplying the input by a complex exponential at the mode frequency, $$d_m(t)=e^{j\omega_m t}x(t). \tag{6}$$

The baseband signal $d_m(t)$ is then filtered according to the mode damping, $$g_m(t)=\gamma_m d_m(t)+e^{-\alpha_m}g_m(t-1), \tag{7}$$

and the resulting mode envelope $g_m(t)$ is modulated back to the audio band, $$y_m(t)=e^{-j\omega_m t}g_m(t). \tag{8}$$

Using this architecture, rooms and objects may be simulated by tuning the filter resonant frequencies and dampings to the corresponding room or object mode frequencies and decay times. The parallel structure allows the mode parameters to be separately adjusted, while the first-order update provides interactive control with no computational latency.

Referring to Eq. 5, the computational cost is one complex multiply/accumulate (i.e. mac) and two real multiplies per mode per sample, and the memory cost is six samples (four coefficients, two states) per mode. Depending on the mode count—as described below, around 1000 modes are sufficient to model a medium-sized room and 300 for a spring reverberator—the present inventors expect the computational cost of the modal reverberator to be a little less than that of a convolutional reverberator. However, the memory cost will be far less than that of a comparable convolutional or delay network reverberator.

Modal Reverberator Design Examples

The modal reverberator is designed by choosing the number of modes, and the mode frequencies, dampings and amplitudes. The present inventors recognize three approaches:

- behavioral, fitting mode parameters to system measurements;
- analytical, deriving mode parameters from system physics; and
- perceptual, selecting mode parameters according to a desired equalization and $T_{60}$.

In the following, an example of each is presented.

Behavioral: Measured Room Response

In this example, the mode parameters may be estimated from a room impulse response by first analyzing the response power spectrum to estimate the modal frequencies, then studying the response spectrogram to estimate the mode dampings, and finally using the room impulse response to fit the mode amplitudes.

Figure 2:
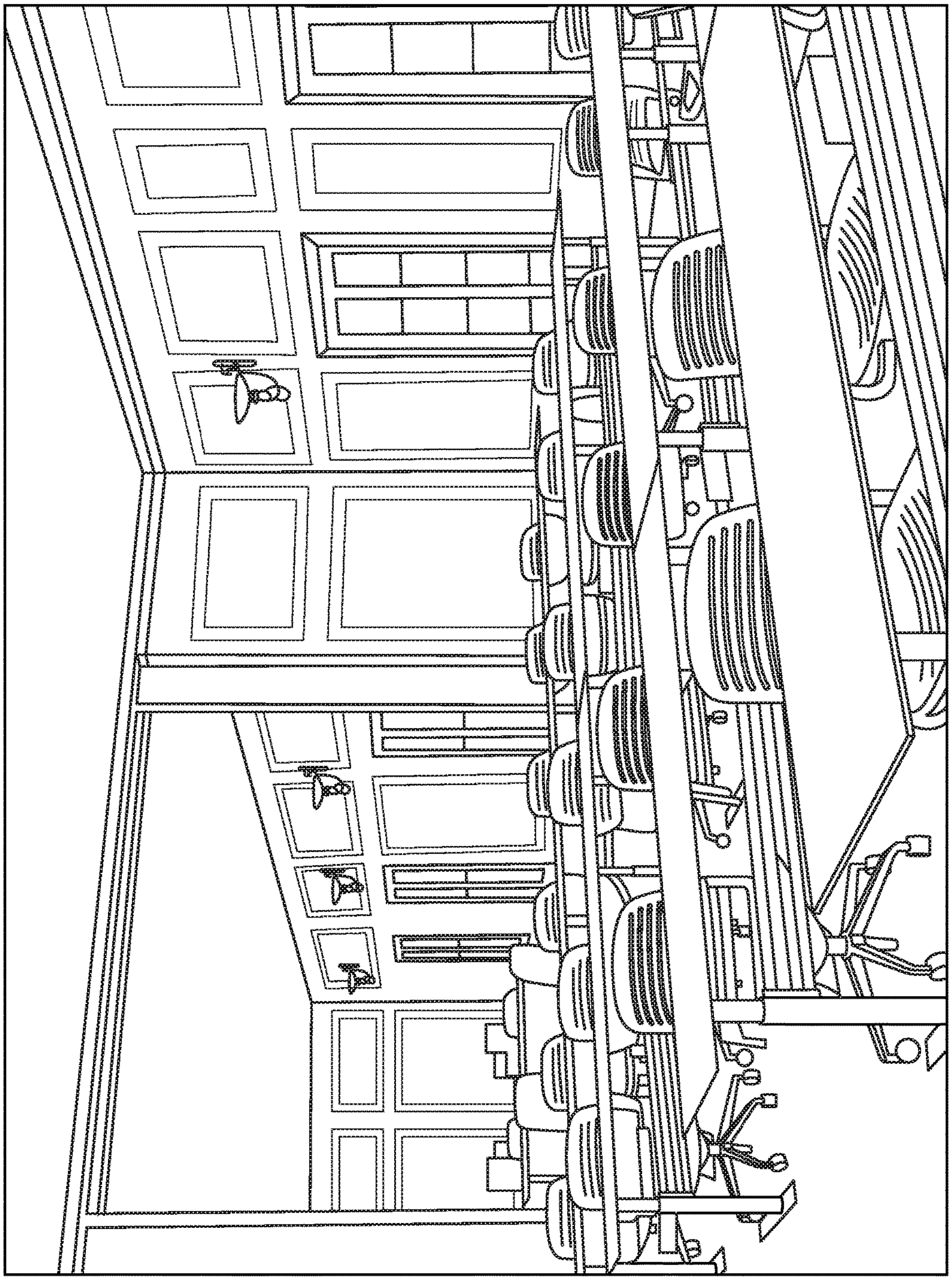
FIG. 2 is a picture illustrating an example room used in descriptions of embodiments of the invention.
Figure 3:
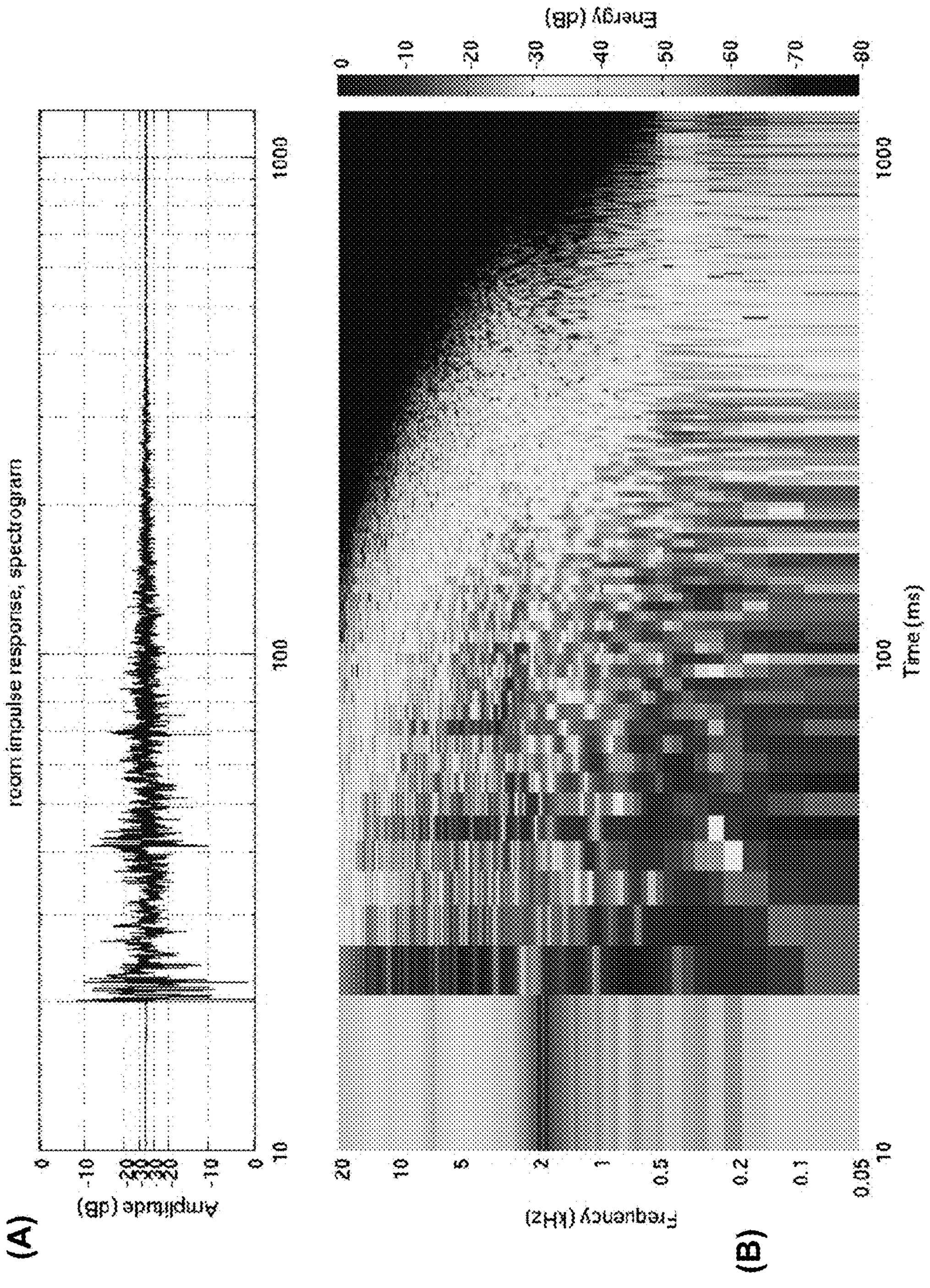
FIG. 3 are plots illustrating a measured room impulse response (A) and corresponding spectrogram (B) plotted for the room shown in FIG. 2. Note the logarithmic time axis used here to reveal details of the perceptually important room impulse response onset.
Figure 4:
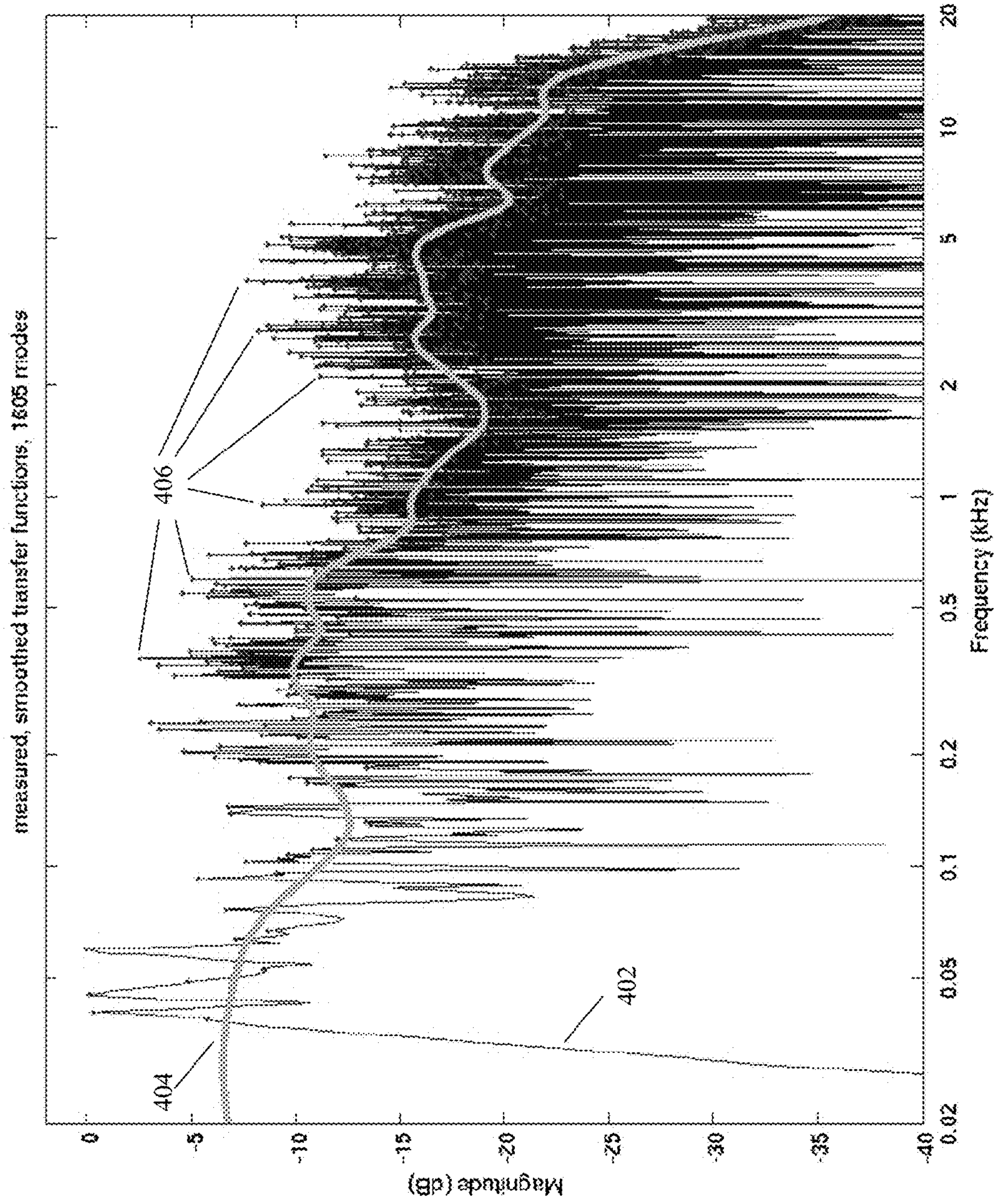
FIG. 4 is a plot illustrating a Room Transfer Function Magnitude. The measured room transfer function magnitude and its critical-band smoothed version are shown; spectral peaks having magnitude greater than 6 dB below the critical-band smoothed magnitude are marked.

Consider the medium-sized room shown in FIG. 2, and an associated measured room impulse response and spectrogram shown in FIG. 3. The room transfer function magnitude 402 (i.e. the magnitude of the discrete Fourier transform of the entire room impulse response) is shown in FIG. 4. Peaks in the magnitude spectrum occur roughly at the mode frequencies. Note that if the loudspeaker and microphone used to measure the room impulse response are co-located, then the complex mode amplitudes will all have zero phase. As a result, the room response spectral peaks will roughly occur at the room mode frequencies. Even when the loudspeaker and microphone are not co-located, the spectral peak frequencies and modal frequencies will often approximately align. Here the mode frequencies $\omega_m$ are estimated as the frequencies of spectral peaks. To capture the most perceptually important modes, only the spectral peaks 406 having magnitudes that exceed the critical-band smoothed magnitude 404 by a given ratio are chosen to be modeled, as illustrated in FIG. 4. In this way, the mode count M is determined by the choice of this given ratio.

Figure 5:
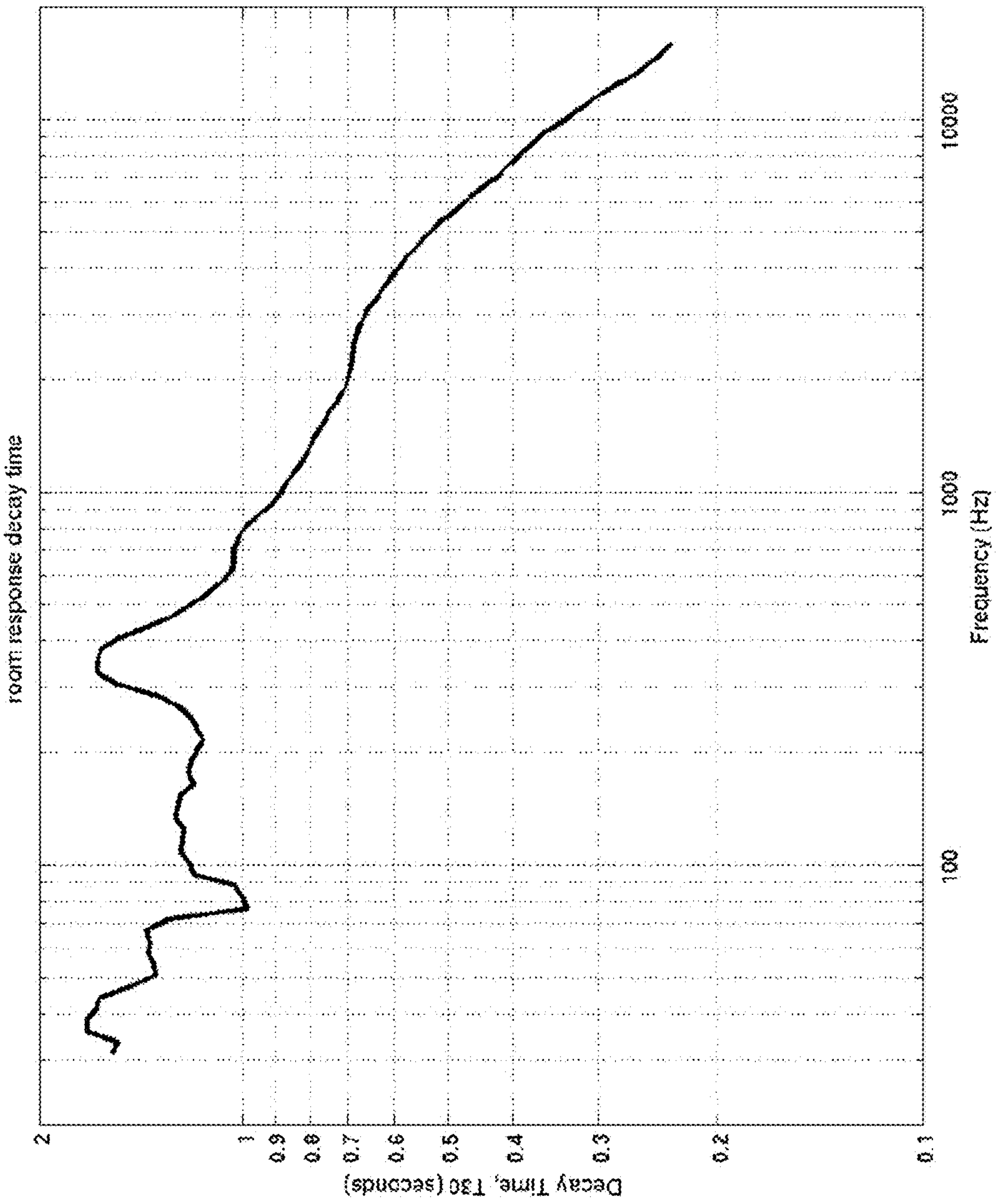
FIG. 5 is a plot illustrating a Room Reverberation Time. The room reverberation time $T_{30}(\omega)$, measured in a sliding quarter-octave band, is plotted.

The mth mode damping is then approximated using the room impulse response decay time in a band about that frequency, $T_{30}(\omega_m)$, $$\alpha_m = \frac{\ln(1000)}{T_{30}(\omega_m)f_s}, \tag{9}$$

where $f_s$ is the system sampling rate. FIG. 5 shows the room's decay time as a function of frequency, computed in a quarter-octave-wide band about a sliding center frequency. While the estimated band decay times vary smoothly with frequency, the individual mode decay times are expected to have more variation.

Finally, the mode amplitudes $\gamma_m$ are found by a least-squares fit to the measured room impulse response. Denoting by $\tilde{h}$ the column of measured impulse response samples, and by $\gamma$ the column of unknown complex mode amplitudes, yields $$\gamma=(G^TWG)^{-1}G^TW\tilde{h}, \tag{10}$$

where G is an M-column matrix of complex mode responses, $$G = \begin{bmatrix} 1 & \dots & 1 \\ e^{(j\omega_1-\alpha_1)} & \dots & e^{(j\omega_M-\alpha_M)} \\ \vdots & & \vdots \\ e^{(j\omega_1-\alpha_1)T} & \dots & e^{(j\omega_M-\alpha_M)T} \end{bmatrix} \tag{11}$$

with T+1 being the length of the impulse response in samples, and W is a positive-definite weighting matrix, for instance used to emphasize a good fit to earlier impulse response samples.

It should be noted that the mode amplitudes $\gamma_m$ found above by the least-squares fit provide an accurate model for a source and listener (i.e. driver and pickup) positioned in the room when measurements were taken. Those skilled in the art will appreciate that when either or both of these positions are changed, different modes will be captured differently, and so the amplitudes should be adjusted. There are several different ways these adjustments can be performed. For example, several different measurements can be performed with different source and listener positions to obtain respective impulse responses for the same room. Using a model of the modal spatial patterns along with the speed of sound, the "measured" amplitudes for any arbitrary source and listener positions in the room can be estimated from the measured impulse responses, and a fit can be performed to those estimated "measured" amplitudes to obtain the modeled mode amplitudes. Those skilled in the art will understand how to perform these and other mode amplitude adjustments in accordance with source and listener positions after being taught by the present examples.

Figure 6:
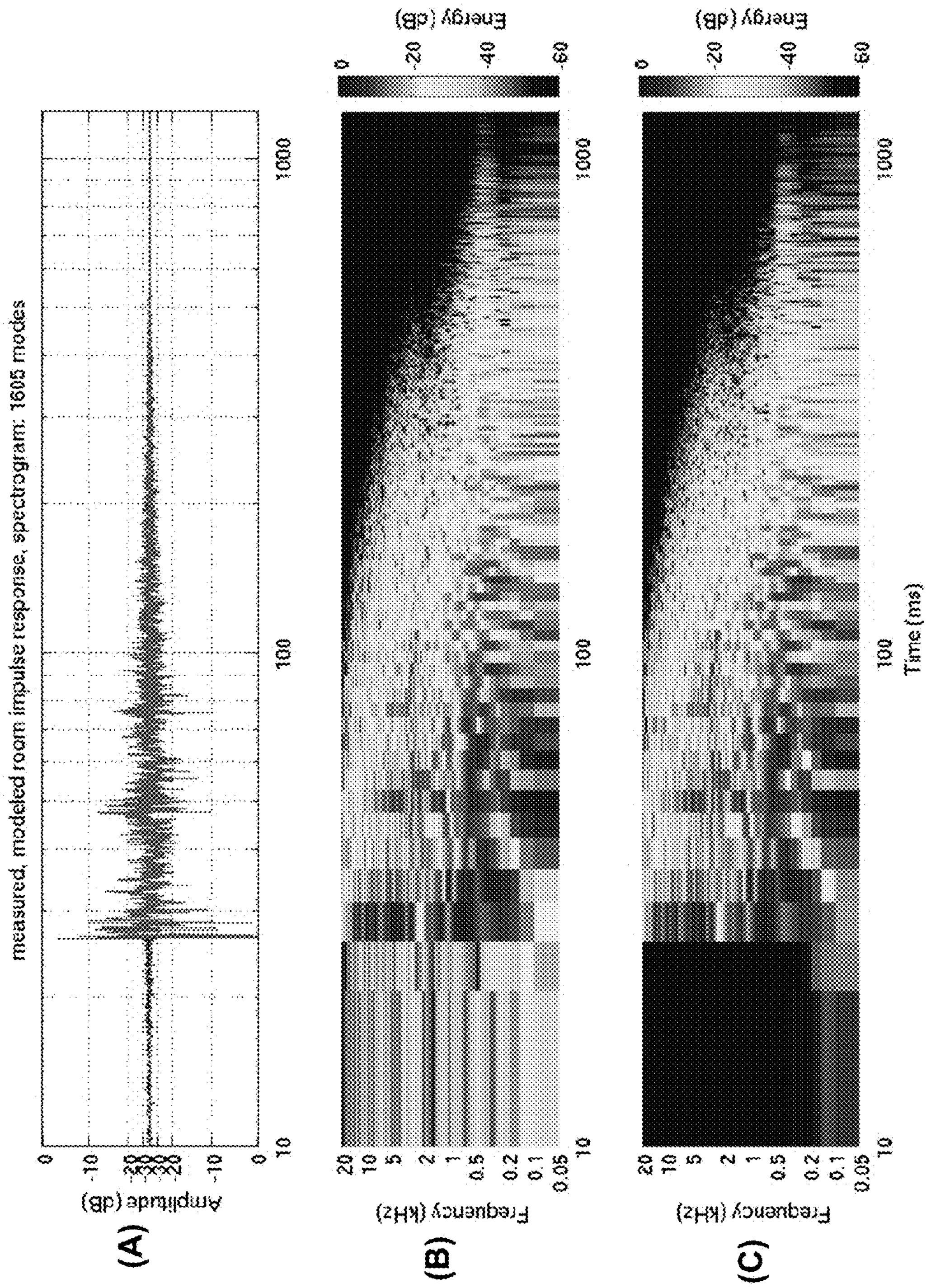
FIG. 6 illustrates Measured, Modeled Room Responses and Spectrograms. The measured and modeled room impulse responses are overlayed (A), and the corresponding spectrograms shown ((B), modeled; (C), measured).

FIG. 6 shows the measured room impulse response and the modal reverberator impulse response, modeled using the 1605 modes marked in FIG. 4 and fit using Eqs. 9 and 10. The modeled impulse response and spectrogram closely match the measured impulse response and spectrogram very well, except for a subtle background of broadband noise, visible only before the direct path arrival. As a result, the measured and modeled impulse responses are very good perceptual matches.

In order to determine the mode count needed to provide an adequate perceptual match, modal reverberators having various mode counts ranging from 57 modes to 1605 modes were auditioned, with the result that about 1000 modes were sufficient to achieve an excellent perceptual match to the measured impulse response. As the mode count was decreased below about 800 modes, the synthesized impulse response began to sound "metallic" and less like an acoustic space.

Figure 7:
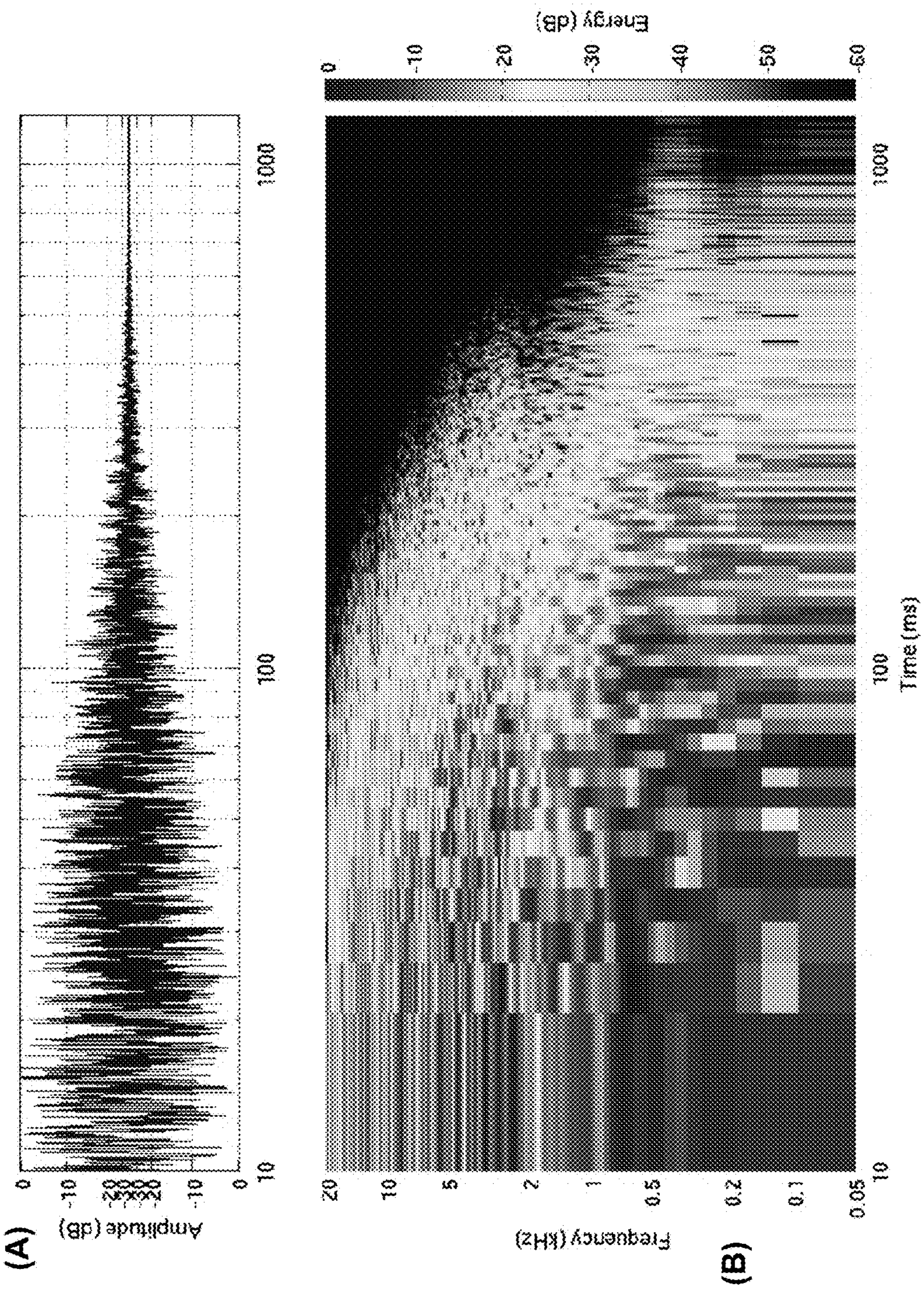
FIG. 7 are plots illustrating a Modeled Room Response, Random Mode Phases (A) and corresponding spectrogram (B).

Modal reverberator impulse responses were also evaluated using the estimated mode frequencies, dampings and amplitudes, but with randomized phases for each of the modal amplitudes. The idea was to explore the perceptual importance of the mode phases. The resulting impulse response and spectrogram, corresponding to the 1605 mode case of FIG. 6, are shown in FIG. 7. Note that whereas the response based on the modeled mode phases shows a typical room response behavior, with a direct path and early reflections giving way to a noise-like late field, the response based on random mode phases is immediately dense, and maintains an exponential envelope. Perceptually, the responses are similar, with the differences being concentrated at the impulse response onset. Loosely speaking, the response generated using random mode phases sounds somewhat more like a struck object than a room.

Analytical: Spring Reverberator

The present inventors recognize that helical coils support a number of audio-frequency wave propagation modes, and have long been used to delay and reverberate audio signals. Hammond introduced a system for artificial reverberation for use with their organs that drove and detected longitudinal waves on a spring (see, e.g, L. Hammond, "Electrical Musical Instrument," U.S. Pat. No. 2,230,836, Feb. 4, 1941). The present inventors further recognize that modern spring reverberators (see, e.g., H. E. Meinema et al., "A New Reverberation Device for High Fidelity Systems," J. Audio Eng. Soc., vol. 9, no. 4, pp. 284-289, 324-326, 1961 ("Meinema")), commonly found in guitar amplifiers, operate in much the same way, with a spring held under tension between a torsional driver and pickup, as seen in FIG. 9(A).

Figure 8:
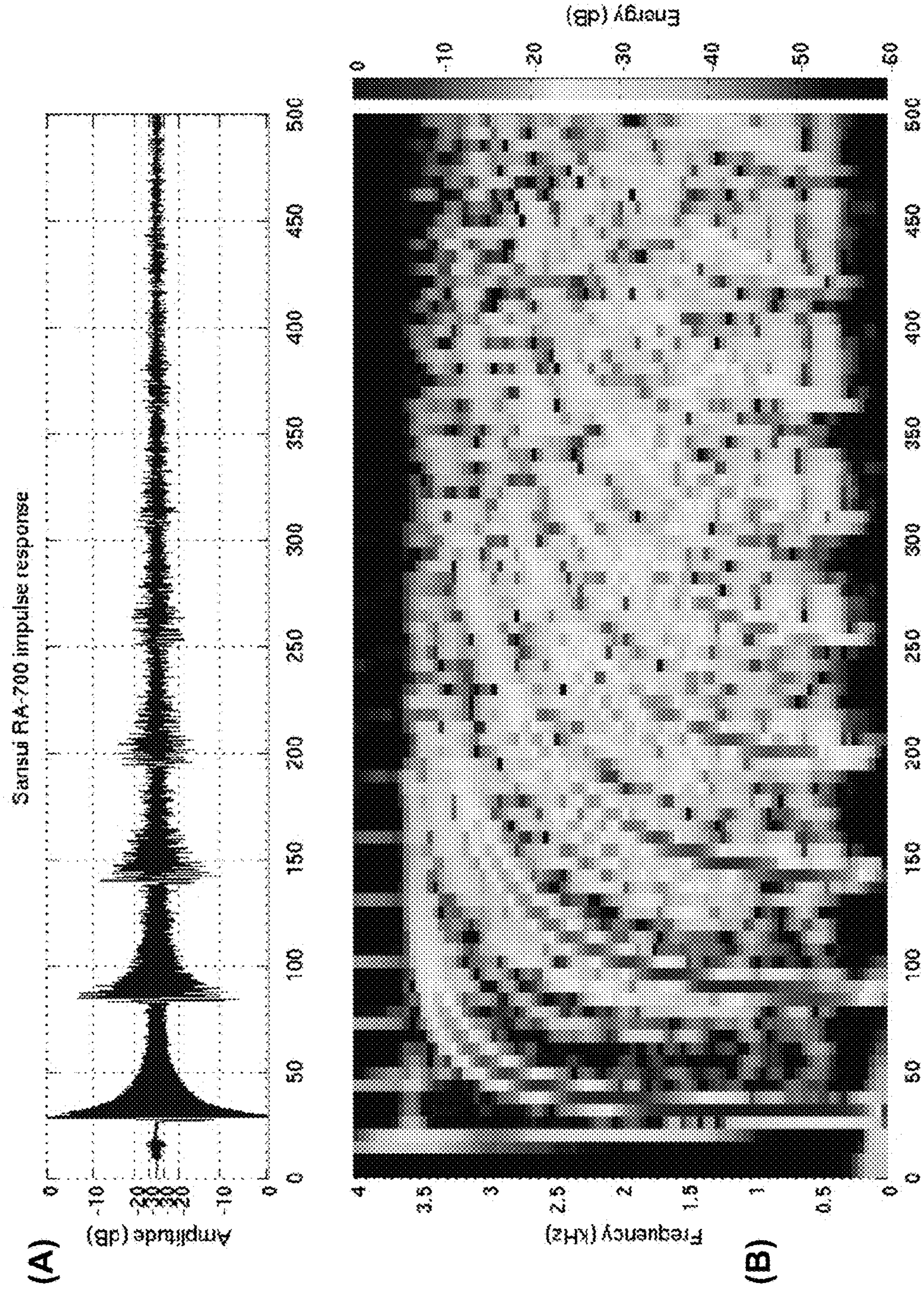
FIG. 8 are plots illustrating an example Sansui RA-700 Response Onset. The Sansui RA-700 spring reverberator employs a single helical coil, with a torsional driver at one end and a torsional pick-up at the other end. Its impulse response onset (A) and corresponding spectrogram (B) are shown. Note the dispersive nature of the arrivals and the presence of a cutoff frequency around 3.6 kHz.

The idea Hammond had was to create a series of echoes reminiscent of room acoustics, as the waves traveled back and forth between the ends of the spring. However, the dispersive nature of spring wave propagation instead produces a sequence of chirps, giving spring reverberators their distinctive sound. The dispersive wave propagation and cutoff frequency are evident in the measured impulse response of a Sansui RA-700, a consumer audio processor using a single spring element, shown in FIG. 8.

Figure 9:
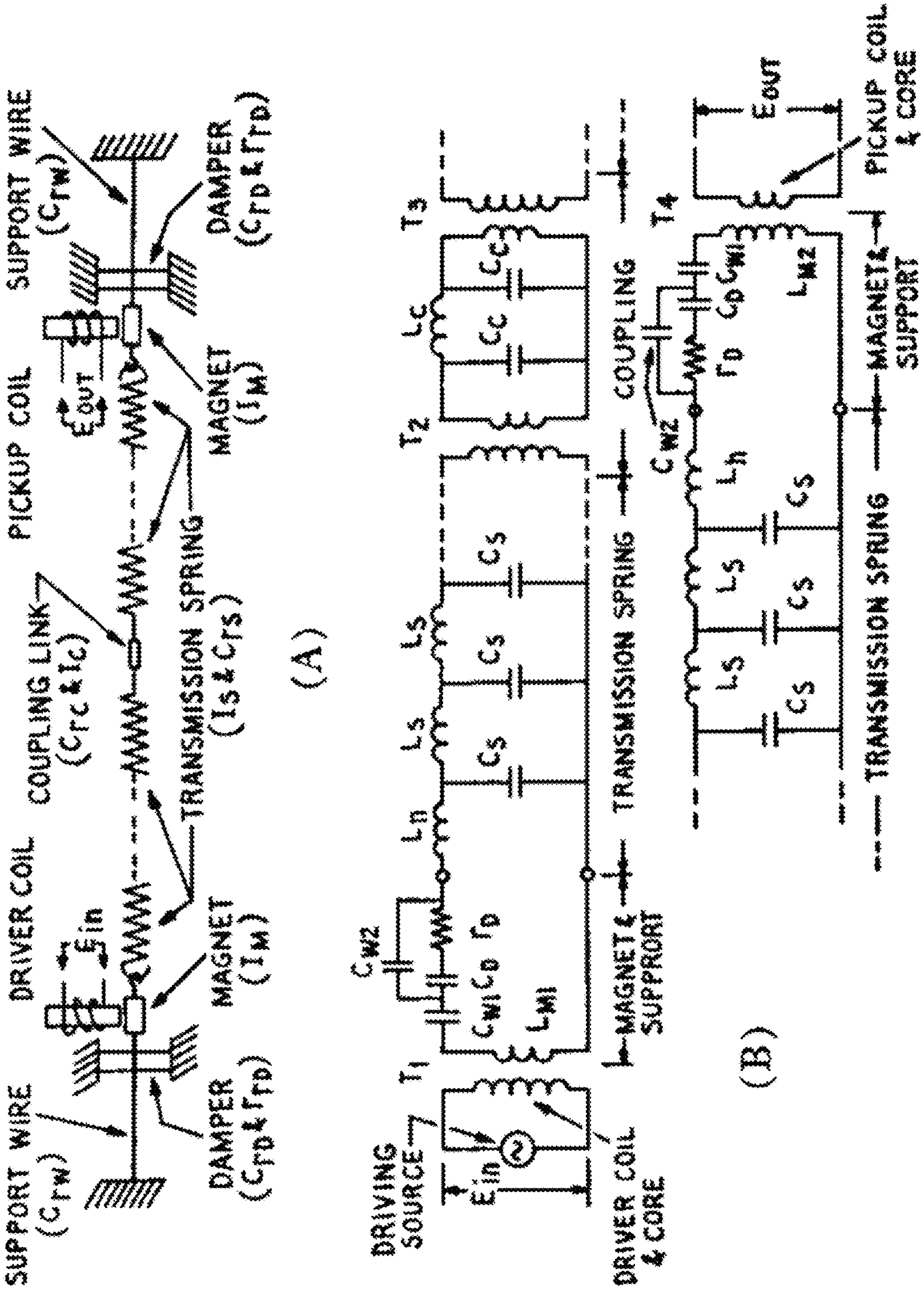
FIG. 9 are diagrams illustrating a Lumped Mass-Stiffness Spring Propagation Model, from Meinema. The lumped element propagation model from Meinema is shown in (B), wherein each coil of the spring in (A) is represented by an inductor-capacitor pair in a transmission line.

The present inventors further recognize that torsional wave propagation on a helical coil can be modeled using a discrete one-dimensional spring-mass lattice, identifying each loop of the helical coil with a torsional lumped compliance and inertance (see FIG. 9(A)). Meinema describes such a lumped element model for a spring reverberator (see FIG. 9(B)), and Della Pietra and della Valle (e.g. L. Della Pietra et al., "On the Dynamic Behavior of Axially Excited Helical Springs," MECCANICA, vol. 17, pp. 31-43, 1982) noted that this model predicts the measured dispersion of helical coils used in automotive applications. Using this model, for a spring having M coils, there will be M modes, with the modal frequencies given by $$\omega_m = \omega_c \sin\frac{\pi}{2}\frac{m}{M},\ m = 1, 2, \ldots, M. \tag{12}$$

where $\omega_c$ is the spring cutoff frequency. In many cases, the number of spring coils is not known, but the low-frequency travel time between the driver and pickup $\tau_0$ is available. In this case, the mth mode frequency $\omega_m$ may be written as $$\omega_m=\omega_c \sin k_0 m, \tag{13}$$

where $k_0$ is related to the wavenumber associated with the first mode, $$k_0 = \frac{2\pi}{\omega_c\tau_0}. \tag{14}$$

Here, the number of modes M is given by $$M = \left\lfloor \frac{\pi}{2k_0} \right\rfloor. \tag{15}$$

As an example of an analytically designed modal reverberator according to embodiments of the invention, the Sansui RA-700 spring is modeled. The cutoff frequency and propagation delay were measured to be 3626 Hz and 52.25 ms, respectively, from which the mode frequencies were computed. In one example, 300 modes were used, slightly less than given by Eq. 15. The mode dampings $\alpha_m$ were set to give decay times of 1000 ms, independent of frequency. The complex mode amplitudes were fixed according to a resonant low-pass characteristic suggested by the transfer function magnitude of the measured spring impulse response. Since the driver and pickup were at opposite ends of the spring, the phase of the mth complex mode amplitude was given an additional phase of $\pi$m. Had the driver and pickup been co-located, the additional phase would have been set to 2$\pi$m, equivalently zero. It should be noted that different phases other than $\pi$m and 2$\pi$m can be used to simulate changes in source and listener positions.

Figure 10:
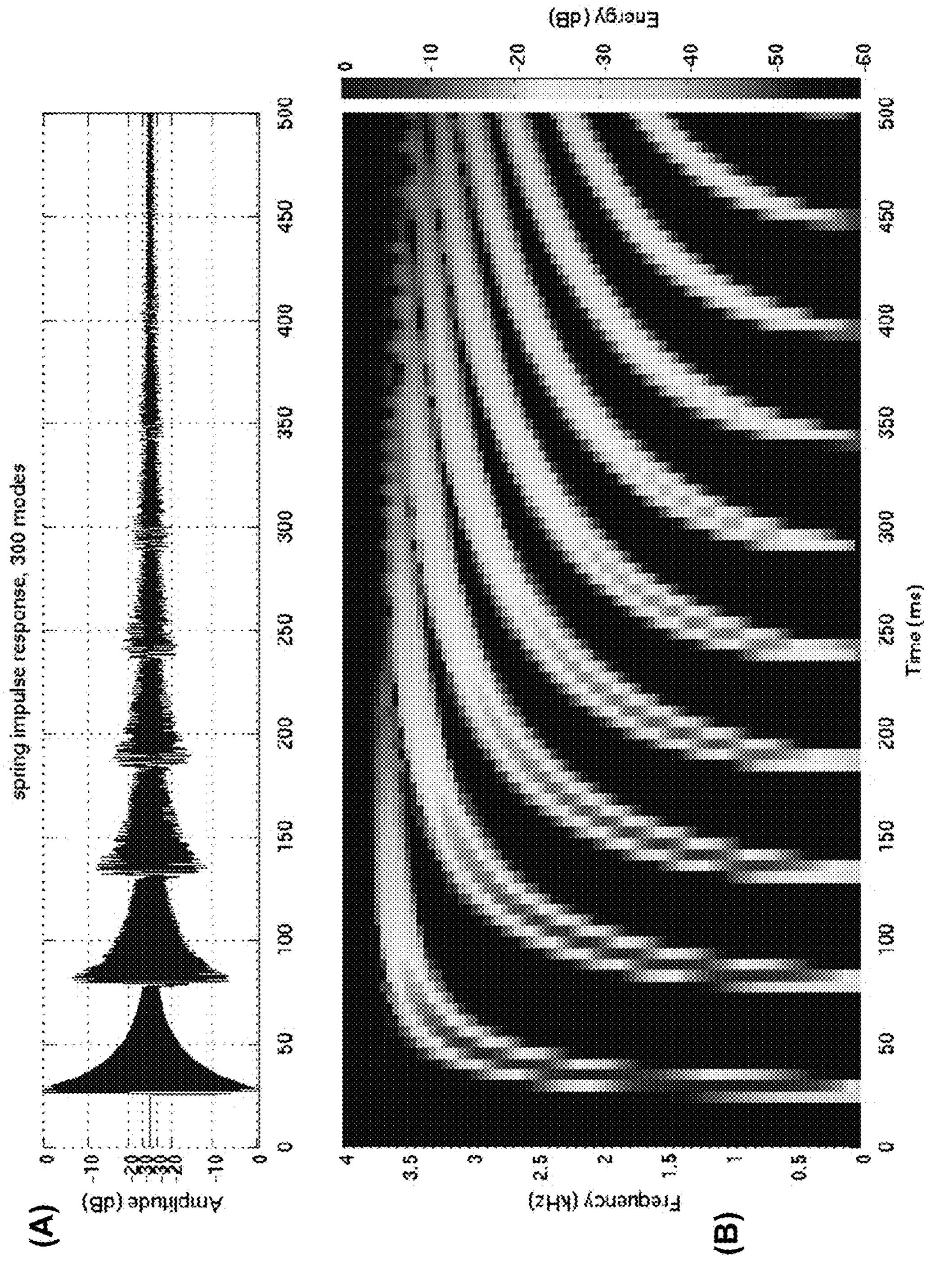
FIG. 10 provides plots illustrating an example Sansui RA-700 Modeled Response. The RA-700 impulse response onset (A) and spectrogram (B) are shown for a model using 300 modes. Note that the dispersion and cutoff behavior associated with the torsional propagation mode are effectively captured, as is the energy decay. The spectral "wash," thought to result from imperfections in the spring causing perturbations in the mode frequencies, is not modeled.

The model impulse response onset and spectrogram are shown in FIG. 10. Comparing the model response in FIG. 10 with the measured response in FIG. 8, the dispersion and cutoff frequency are well modeled, and the perceptual match in informal listening tests when applied to broadband material, such as guitar and drums, is good. One feature not modeled well is the "wash," the broadband noise present in the decay, as can be seen by the distinct bands in the spectrogram of FIG. 10(B) compared to the more noisy response seen in FIG. 8(B). This "wash" seems to result from imperfections in the spring causing small perturbations in the mode frequencies.

Figure 11:
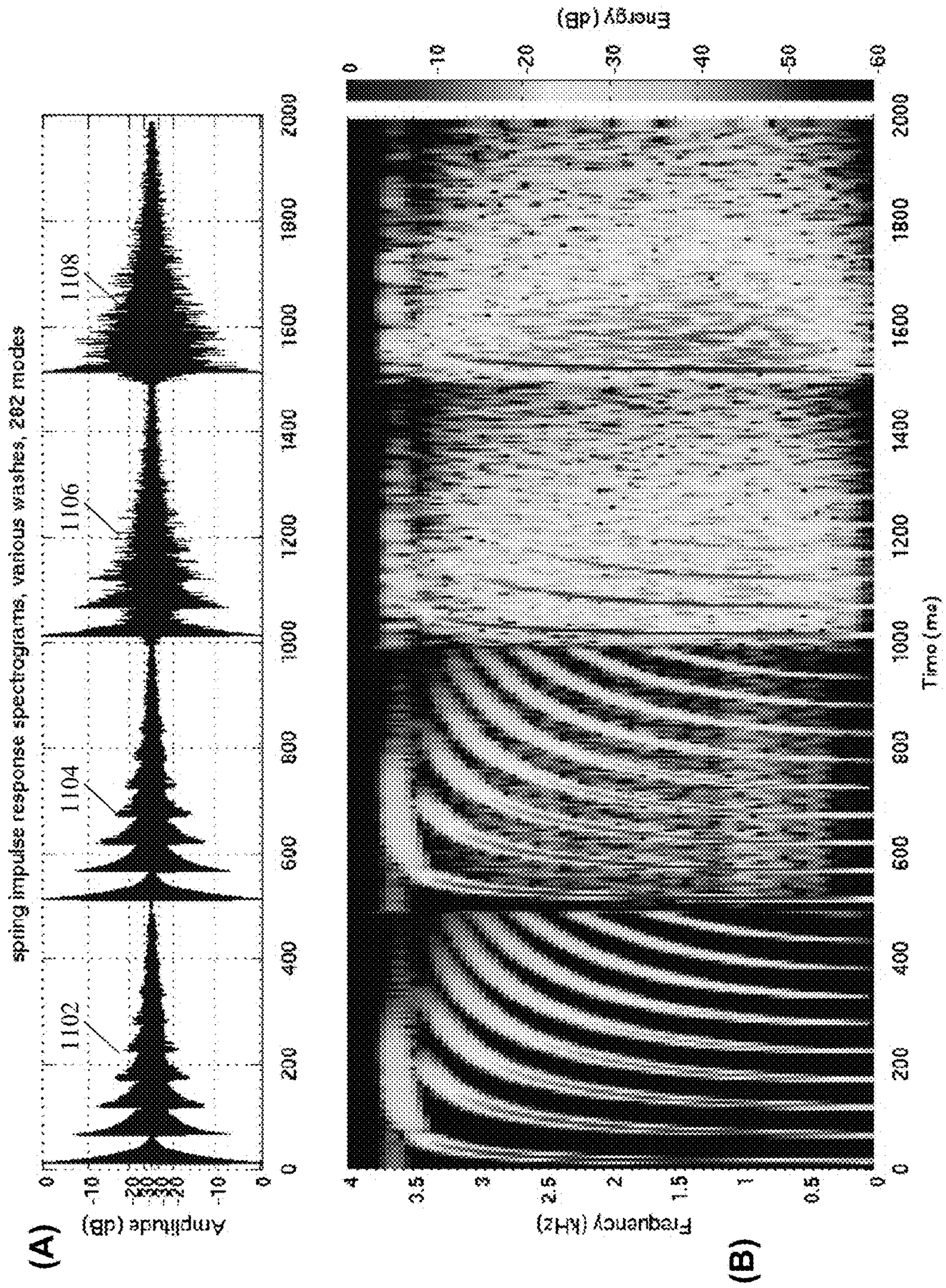
FIG. 11 provides plots illustrating an example Modal Spring Reverb Model, with Various Wash Levels. RA-700 modal reverb model impulse responses (A) and spectrograms (B) are shown, including various amounts of "wash" (increasing left to right), modeled by introducing corresponding amounts of random perturbations into the mode frequencies.

FIG. 11 illustrates that the "wash" can be synthesized by finding mode frequencies associated with a spring-mass system having randomly perturbed masses and stiffnesses. More particularly, FIG. 11(A) shows modal reverb model impulse responses 1102, 1104, 1106 and 1108 and FIG. 11(B) shows their corresponding spectrograms, including various amounts of "wash" (increasing left to right). The different model impulse responses 1102, 1104, 1106 and 1108 are obtained by introducing increasing amounts of random perturbations into the mode frequencies, respectively.

Perceptual: Late Field Description

The perception of a room impulse response late field is largely determined by its initial equalization and decay time as a function of frequency. A perceptual design approach according to embodiments of the invention first generates a set of mode frequencies $\omega_m$, and then specifies mode dampings $\alpha_m$ and mode amplitudes $\gamma_m$ according to a desired initial equalization Q($\omega$) and decay time $T_{30}(\omega)$, rather than from a measured impulse response of a room or resonating object in the above approaches. The mode dampings are determined from the desired decay time directly using Eq. 9. Meanwhile, the mode gain energies need to be scaled according to the local modal density $\rho(\omega)$, for example expressed in modes per Hz of bandwidth, as $$|\gamma_m| = |Q(\omega_m)|/\sqrt{\rho(\omega_m)}. \tag{16}$$

In one example, the phases of the complex mode amplitudes are set randomly, using a uniform distribution on the interval [0, 2$\pi$]. However, particular initial echo patterns may be generated by a fit such as described above.

This approach is similar to the one used for designing a feedback delay network, in which a series filter determines the initial equalization, and loop filters fix the decay time (e.g. J. M. Jot, "Digital Delay Networks for Designing Artificial Reverberators," Audio Engineering Society Convention 90, February, 1991). In the feedback delay network, the delay line lengths and mixing matrix are chosen to provide a pattern of echoes that, over time, give way to a noise sequence without any obvious tones or flutter. In other words, the delay line lengths and mixing matrix control the echo density profile and late-field timbre.

In the perceptually designed modal reverberator, it is the modal density that is controlled. The number of modes M is set, and the mode frequencies $\omega_m$ are generated randomly according to a distribution over a specified audio bandwidth. The inventors have attempted a number of distributions, including uniform, linear and quadratic, corresponding, respectively, to the modal distributions expected for 1-, 2-, and 3-dimensional systems, e.g., a string, membrane, and room, respectively. An exponential distribution has also been used, which generates roughly an equal number of modes in each octave. Similarly, roughly an equal number of modes per critical band may be generated.

Figure 12:
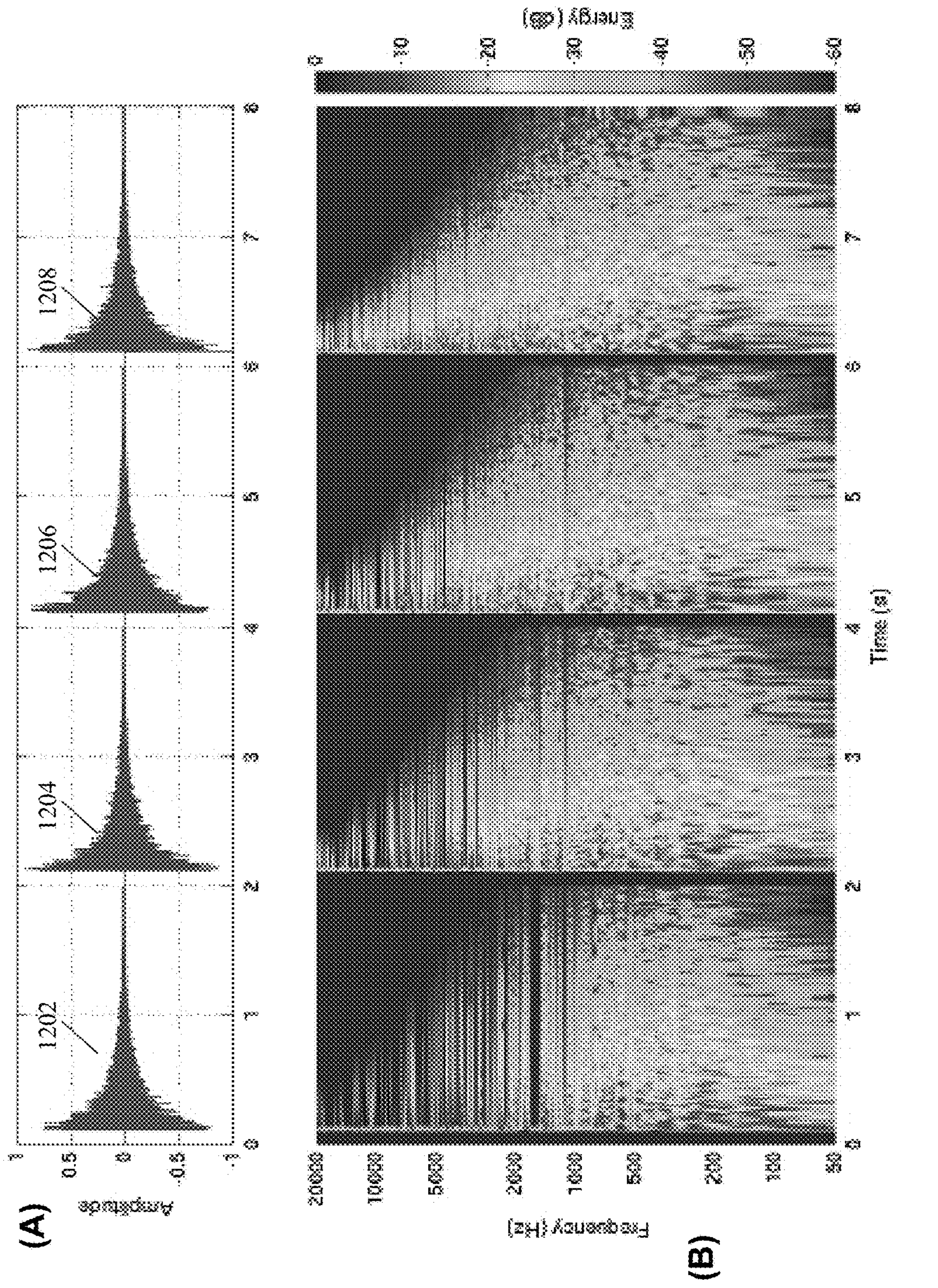
FIG. 12 provides plots illustrating example Synthesized Responses, with Various Mode Counts. Reverberator impulse responses (A) and the corresponding spectrograms (B) synthesized using 256, 512, 1024 and 2048 modes, randomly generated across the audio band, are shown.

Informal listening tests showed only small perceptual differences among the responses synthesized by the various distributions, provided that sufficiently dense sets of modes were generated. Furthermore, the number of modes needed to achieve a dense, noise-like response was roughly 1000-2000 modes, and reasonably independent of the generating distribution. FIG. 12(A) shows impulse responses 1202, 1204, 1206 and 1208 synthesized using this perceptual design method, with mode counts of 256, 512, 1024 and 2048, respectively. Note the presence of isolated resonances for the smaller mode counts in the corresponding spectrograms of FIG. 12(B) (e.g. the dark horizontal bands in the spectrogram for impulse response 1202 that are not present in the spectrogram for impulse response 1208).

Finally, in real acoustic spaces, nearby modes can have noticeably different amplitudes and dampings, and adding a bit of random variation to the dB mode amplitudes and decay times can provide a subtly more "natural" response.

Modal Reverberator Extensions

The present inventors have explored a number of extensions to the basic modal reverberator structure described above, including interactive control applications, efficient computational architectures and envelope control methods. These extensions leverage the advantages of the present invention, which allow the mode frequencies, dampings and amplitudes to be individually controlled to obtain desired effects.

(1) Interactive Control

Two example interactive control applications according to embodiments of the invention are morphing between reverberators and controlling room size. Consider the case of two or more rooms that have been modeled according to embodiments of the invention using the same number of modes. The room modes can be ordered according to mode frequency so that the mth mode of every room has the mth smallest mode frequency of that room. Morphing among the rooms is then done by crossfading among their respective mode parameters, separately for each of the M modes. Example embodiments include logarithmically crossfading the mode frequencies and magnitudes, while linearly crossfading the phase of the mode complex amplitudes and the decay times associated with the mode dampings.

In the case that the reverberators have different mode counts, it is suggested to add modes to the reverberators with fewer modes. These added modes would have the same mode frequencies and dampings as selected existing modes, but would be available to crossfade with the "extra" modes of the more complex reverberators.

Changing room size by a given factor may be implemented by reducing the mode frequencies by the same factor to account for the fact that frequencies with proportionally the same wavelength should be treated in the same manner. Additionally, the damping should be adjusted so that the reverberation time is changed roughly by the scale factor, thus accounting for the different rate of interaction with absorbing surfaces. Since high frequencies are more readily absorbed by air, increasing room size should result in slightly less of an increase in decay time at high frequencies that would be suggested by a simple scaling of the original decay times.

(2) Efficient Architectures

In an acoustic space, the complex mode amplitudes of the modal response are influenced by both the source and listener positions (equivalently, both the driver and pick-up positions affect the complex mode amplitudes for an electromechanical reverberator). In fact, the complex amplitude $\gamma_m$ for a given mode is the product of two individual complex amplitudes determined by these positions. In this way the mth mode response for a particular pair of source and listener positions may be seen as the series combination of a source complex gain, the mode envelope filtering, and a listener complex gain.

Figure 13:
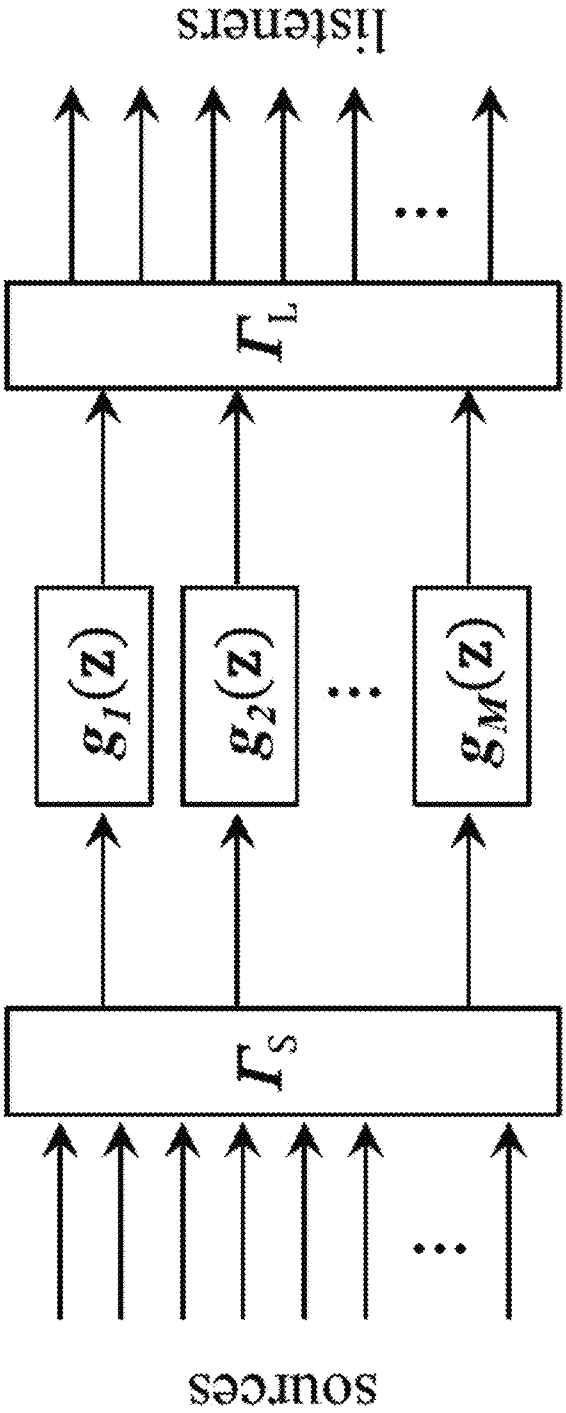
FIG. 13 is a block diagram illustrating an example Efficient Multiple-Source Multiple-Listener Signal Flow Architecture according to embodiments of the invention.

The mode frequencies and decay rates, however, are properties of the acoustic space (or electromechanical system) and are independent of source and listener positions (driver and pick-up positions). Thus, the previously described decomposition can be used to efficiently calculate system responses for any number of source-listener location pairs by implementing a single set of mode filters with varying source and listener gains. The input to each mode filter is calculated as the sum of all source signals, each scaled by the associated source complex gain for that mode, and the output signal at each listener position is calculated as the sum of all mode filter outputs, scaled by the associated listener complex gains. Using this arrangement, depicted in FIG. 13, the mode filtering (i.e. filters $g_1(z)$ to $g_M(z)$) is implemented only once, and the cost of an additional source or listener is that of a complex multiply-accumulate at the input or output of each mode filter, respectively.

(3) Envelope Control

In coupled spaces and ones with complex geometries, the reverberation can take on a two-stage decay or a delayed onset in which the energy envelope builds before decaying exponentially. Such envelope control is straightforward to implement in the modal reverberator architecture. Multiple stages of decay are generated by assigning different decay rates (i.e., dampings) to different modes. For instance, in a coupled space, say, a box seating area in an opera hall, modes associated with the box would have more damping, and louder complex amplitudes, compared with the modes associated with the rest of the hall, resulting in an initial fast decay, followed by a slow decay.

In fact, the envelope of each mode can be controlled by replacing the first-order complex mode filter (Eq. 5) with a higher-order filter, or even an FIR filter. As an example, the iterated convolution used by Alvin Lucier in his piece "I'm Sitting in a Room" can be implemented by repeatedly applying the mode filters to produce a $t^p \exp\{-\alpha_m t\}$ mode response envelope for processing by p+1 rooms (see, e.g. J.

S. Abel et al., "Luciverb: Iterated Convolution for the Impatient," Audio Engineering Society Convention 133, October, 2012).

Note that different mode damping filters (Eq. 7) may be used to implement different mode envelopes. For instance, the parallel or cascade combination of one-pole filters can be designed to implement a two-stage decay or delayed onset mode envelope. To simulate the repeated application of a room response, for example as in the "Luciverb" effect, the mode filter damping filter (Eq. 7) is repeatedly applied.

(4) Audio Effects

In addition to modeling acoustic spaces and resonant objects, the structure may be used to generate a number of audio effects.

Using the mode filter implementation described in Eqs. 6, 7 and 8, note that the envelope signals $g_m(t)$ may be resampled to a different time axis, for example by linear interpolation. Doing so will time-stretch the resulting baseband signals $y_m(t)$ and output signal y(t) to the new time axis, but since the modulation frequencies $\omega_m$ are unchanged, the time stretching experienced by the mode output and system output will not affect their spectral content. Put differently, a signal may be time stretched and reverberated without changing its pitch by simply time stretching the mode envelopes. If the reverberation time is made small, for example on the order of 50-100 ms, the effect becomes one of time stretching only. In a preferred embodiment, the present inventors have discovered that the time stretching has fewer artifacts when the one-pole damping filters are applied twice.

Note that in the mode filter implementation described in Eqs. 6, 7 and 8, there is no fixed relationship between the heterodyning frequency $\omega_{m_h}$ and the modulation frequency $\omega_{m_m}$. If the modulation frequency were a given scaling ρ of the heterodyning frequency for all of the modes, $$\omega_{m_m}=\rho\omega_{m_h}, \tag{17}$$

then the mode output signals $y_m(t)$ and the overall output signal y(t) will be pitch shifted according to the scaling ρ. (Note that no pitches outside the range of human hearing need to be processed.)

Other pitch changing effects can be generated by manipulating the modulation frequencies, for instance by making them time varying to produce a tremelo effect, to quantize them to certain musical notes in an AutoTune-type effect, or to scramble them, connecting certain modulation frequencies with other heterodyning frequencies.

Such effects are also possible with the complex one-pole mode filters of Eq. 5 by running two filters in parallel, one running with the original modulation frequency (the analyzer) and the other operating with the effect modulation frequency (the synthesizes). In this configuration, the amplitudes of the "analyzer" filter are imprinted on the "synthesizer" filter.

A distortion effect is also available by separately or in groups applying a memoryless nonlinearity (or other distortion) to the modulation sinusoids used to reconstruct the output, or simply by substituting waveforms such as square or sawtooth waves for the modulation sinusoids. Separately distorting the modulation sinusoids produces a distorted output free of intermodulation products. In addition aliasing is easily avoided by modulating antialiased waveforms.

Example Implementations

Figure 14:
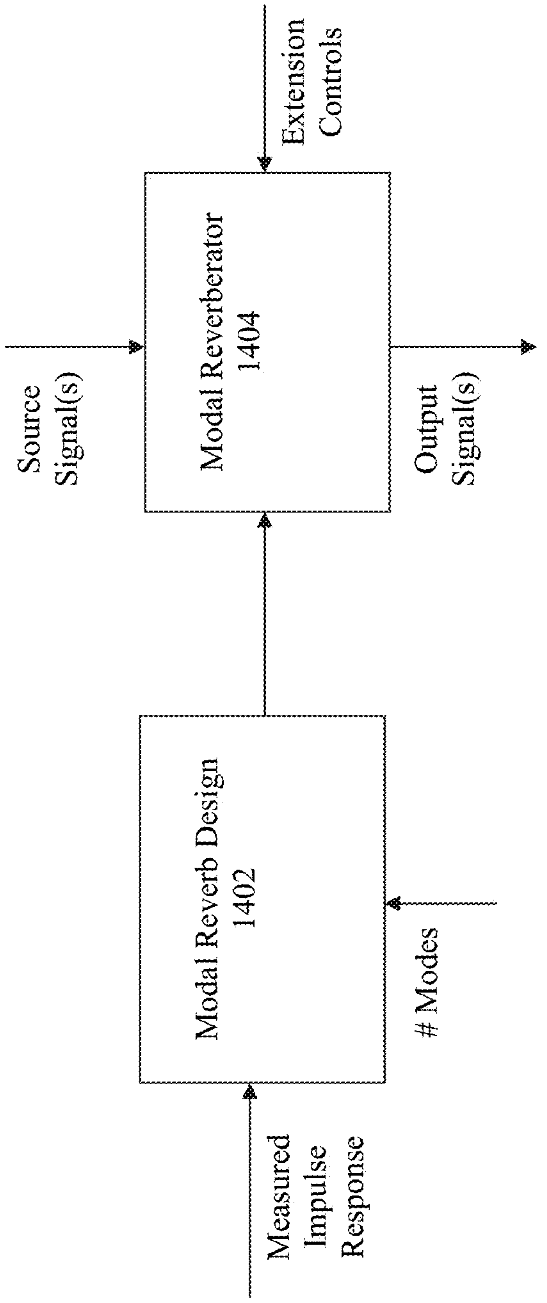
FIG. 14 is a block diagram illustrating an example system according to embodiments of the invention.

FIG. 14 is a block diagram illustrating an example system according to embodiments of the invention. In these and other embodiments, the system can be included in a sound editing application and implemented by a plug-in in a digital audio workstation (DAW).

As shown, the example system includes a design module 1402 and a modal reverberator module 1404. Design module 1402 receives a measured impulse response for a room or resonating object to be modeled. For example, the DAW can include a library of measured responses from which a desired response can be selected. As another example, the measured response can be directly obtained using techniques known to those skilled in the art. Using the measured response, module 1402 then generates the parameters for the modal reverberator, specifically the mode frequencies, dampings and amplitudes for each of the M filters $h_1(z)$ to $h_M(z)$ such as those shown in FIG. 1, using any of the example design methodologies described above, or combinations thereof. As shown, it is possible that the number of modes can be dynamically selected, as well as other design controls described above.

Reverberator module 1404 effectively implements the reverberator structure shown in FIG. 1, which applies artificial reverberation to a source signal that yields an output signal. In the example of FIG. 14, the modal reverberator module 1404 can be dynamically adjusted (e.g. mode parameters changed) to implement any of the extensions described above for a desired effect on the output signal.

It should be noted that design module 1402 and reverberator module 1404 are not necessarily included in the same system in all embodiments.

In one example implementation, the system shown in FIG. 14 is included in a computer configured with DAW software such as Digidesign Pro Tools that supports plugin applications (e.g. AU, VST, RTAS compatible plugins), and possibly having a DSP card (not shown) that accelerates plugin processing. One possible example of a card and corresponding plugin application that can be adapted for use with this invention is UAD-1 DSP card and plugin bundle from Universal Audio of Santa Cruz, Calif. In such an example, the modal reverb techniques of the present invention are included as one plug-in application, or one application of among many plug-in applications provided with the card. In one example embodiment, the computer is a Mac or PC having a processor such as an Intel Pentium or other Intel CPU, AMD Athlon or other AMD CPU, or a Power-compatible CPU.

Audio (either provided within or to the system in real-time or via recorded media) can be processed by the DAW using the plug-in application and the techniques of the present invention. The plug-in application can further allow a user, via a user interface such as a graphical display, mouse, keyboard, etc., to select and adjust the parameters used by modules 1402 and 1404 (e.g. selecting desired impulse responses, number of modes, extension controls, etc.), which can further cause the DAW to process the audio with the desired effect. Those skilled in the art will be able to understand how to implement the invention using software written in accordance with the methodologies described herein for use in a DAW after being taught by the present disclosure.

It should be noted that implementations of the invention apart from sound editing applications such as a DAW are possible. For example, the invention can be included in a live sound system or in embedded applications such as Karaoke systems. In such embedded applications where only a limited amount of memory available, only module 1404 can be included, perhaps along with a number of preset adjustments to mode parameters for respective desired effects.

Although the present invention has been particularly described with reference to the preferred embodiments thereof, it should be readily apparent to those of ordinary skill in the art that changes and modifications in the form and details may be made without departing from the spirit and scope of the invention. It is intended that the appended claims encompass such changes and modifications.

What is claimed is:

1. A method implemented by a computer, comprising:
- receiving a source signal;
- applying, by the computer, artificial reverberation to the source signal by processing the source signal in parallel using a plurality of mode filters, wherein the plurality of mode filters have been designed in accordance with desired properties of one of a room and a resonating object; and
- summing outputs of the plurality of mode filters to produce an artificially reverberated version of the source signal,
- wherein the plurality of mode filters have been designed by measuring an impulse response of the room and selecting a plurality of mode frequencies using the measured impulse response, wherein the plurality of mode filters respectively correspond to the plurality of selected mode frequencies, and
- wherein the plurality of mode frequencies have been selected by comparing a measured amplitude of each of the plurality of mode frequencies with a threshold.

2. A method according to claim 1, wherein the plurality of mode filters have been designed in further accordance with source and listener positions.

3. A method according to claim 1, wherein each of the plurality of mode filters comprises a first-order filter.

4. A method according to claim 3, wherein the first-order filter is specified by a mode frequency parameter, a damping parameter and a complex amplitude, and wherein one or more of the mode frequency parameter, the damping parameter and the complex amplitude have been determined in accordance with the desired properties of the one of the room and the resonating object.

5. A method according to claim 1, wherein the desired properties include a measured direct path response associated with the room.

6. A method according to claim 1, wherein the desired properties include a measured early reflection response associated with the room.

7. A method implemented by a computer, comprising:
- receiving desired properties of one of a room and a resonating object;
- determining, by the computer, parameters for an artificial reverberator in accordance with the desired properties, wherein the artificial reverberator includes a plurality of mode filters for processing an input signal in parallel,
- wherein determining the parameters for the artificial reverberator includes measuring an impulse response of the room and selecting a plurality of mode frequencies using the measured impulse response, wherein the plurality of mode filters respectively correspond to the plurality of selected mode frequencies, and
- wherein the plurality of mode frequencies have been selected by comparing a measured amplitude of each of the plurality of mode frequencies with a threshold.

8. A method according to claim 7, wherein each of the plurality of mode filters comprises a first-order filter.

9. A method according to claim 8, wherein the first-order filter is specified by a mode frequency parameter, a damping parameter and a complex amplitude, and wherein one or more of the mode frequency parameter, the damping parameter and the complex amplitude have been determined in accordance with the desired properties of the one of the room and the resonating object.

10. A method according to claim 7, wherein the desired properties include a measured direct path response associated with the room.

11. A method according to claim 7, wherein the desired properties include a measured early reflection response associated with the room.

* * * * *